United States Patent [19]

Durney

[11] 4,324,330

[45] Apr. 13, 1982

[54] CARD CAGE FOR ELECTRONIC CIRCUIT CARDS

[75] Inventor: David J. Durney, Holland, Pa.

[73] Assignee: Burroughs Corporation, Detroit, Mich.

[21] Appl. No.: 147,510

[22] Filed: May 7, 1980

[51] Int. Cl.³ .............................................. A47G 19/08
[52] U.S. Cl. .................................. 206/328; 206/449; 206/454; 211/41
[58] Field of Search ............... 206/328, 332, 334, 425, 206/449, 454, 455, 456, 587; 211/41, 495

[56] References Cited

U.S. PATENT DOCUMENTS

| | | | |
|---|---|---|---|
| 2,702,127 | 2/1955 | Pastorius et al. | 211/41 X |
| 2,950,001 | 8/1960 | Bucko | 206/454 |
| 2,956,675 | 10/1960 | Gregory, Jr. et al. | 206/449 |
| 2,986,281 | 5/1961 | Jordan | 211/41 C |
| 3,915,307 | 10/1975 | Agarde | 206/328 X |
| 4,099,623 | 7/1978 | Van Osdol | 211/41 |
| 4,184,599 | 1/1980 | Drake et al. | 211/41 |
| 4,261,465 | 4/1981 | Thomas | 211/41 X |

Primary Examiner—Steven M. Pollard
Attorney, Agent, or Firm—Kevin R. Peterson; Robert A. Green; David G. Rasmussen

[57] ABSTRACT

The disclosure is of a card cage made up of identical end plates, between which are secured upper channel members and lower channel members which are identical in structure and which include punched out portions, to which identical card-support members of any desired length can be secured.

2 Claims, 5 Drawing Figures

CARD CAGE FOR ELECTRONIC CIRCUIT CARDS

BACKGROUND OF THE INVENTION

Many types of present day electronic apparatus, such as computers, use card cages for grouping printed circuit board assemblies known as "cards" into operating units. These card cages comprise metal frames which carry sockets, and a group of electronic circuit cards is inserted in the cage, each engaging its own socket. Up to the time of the present invention, each card cage was designed and built to accommodate a selected number of cards of a specific size. In addition, for economy, all of the parts of a card cage are punched out to the desired size and shape, including the card-support members. As card cages increase in size, the parts, including the card-support members, become too large to be punched in one piece. To simplify the manufacture, the card-support members are subdivided to provide spaced-apart channels for receiving the upper and lower edges of each card. This is undesirable because, if a card is slightly bent, it cannot be easily slid into place. In addition, since card cages of the prior art are each of one specific size, there is no flexibility and no adaptability to cards of different numbers and sizes.

The present invention solves those problems.

DESCRIPTION OF THE PRESFERED EMBODIMENTS

Figure 1:
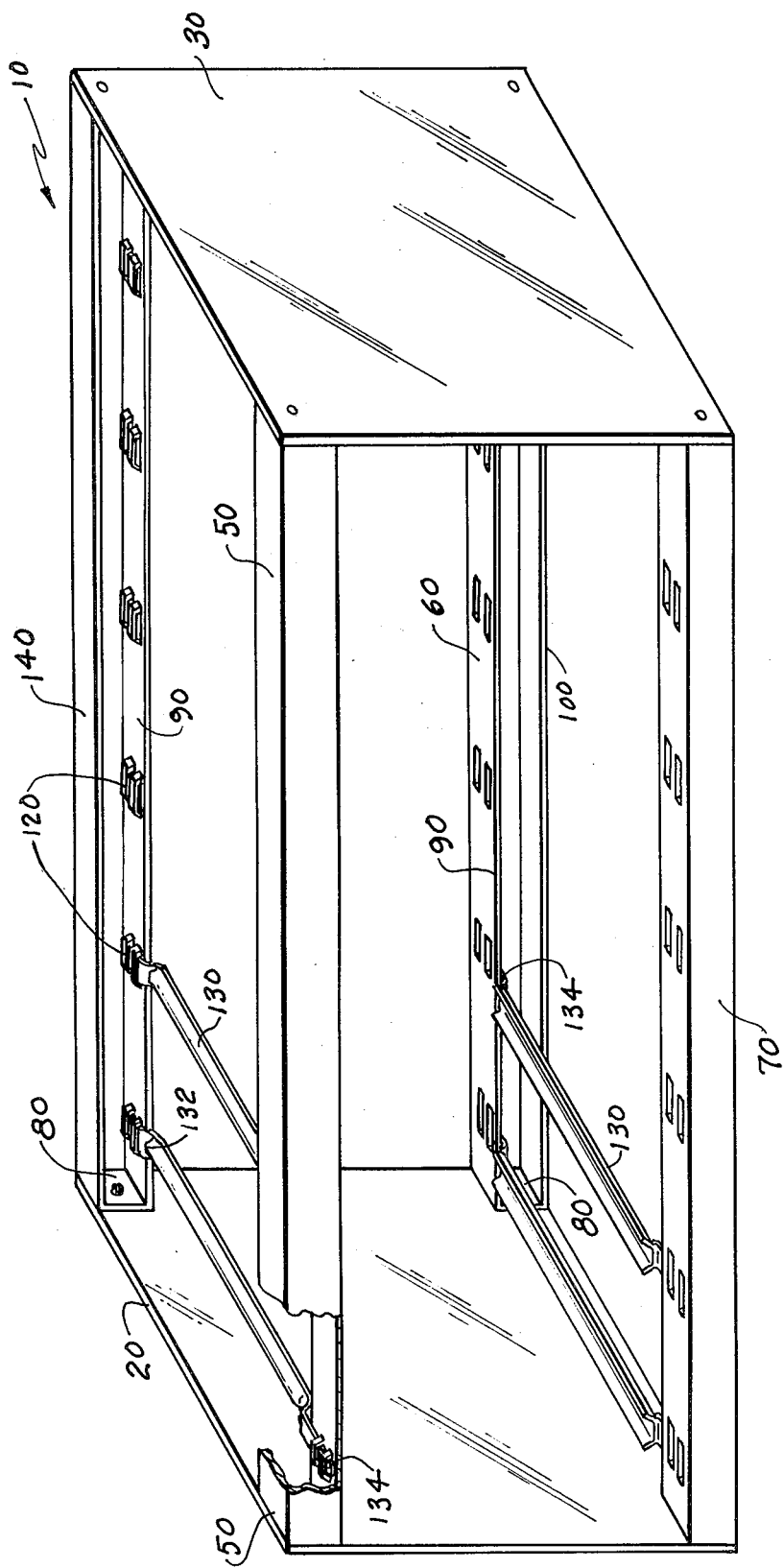
FIG. 1 is a perspective view, partly broken, of apparatus embodying the invention.
Figure 2:
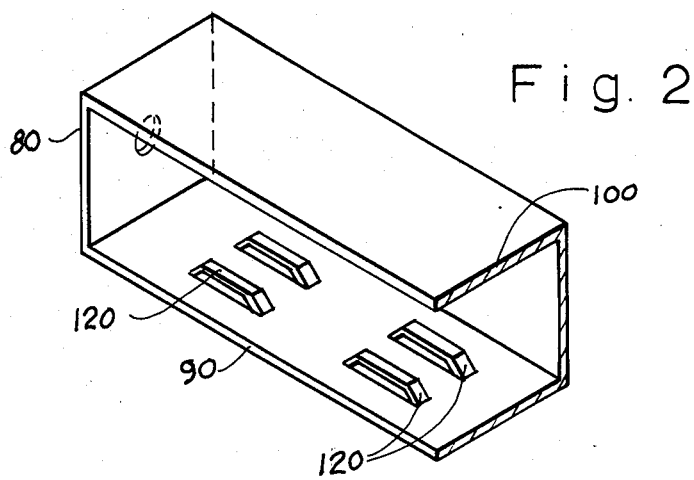
FIG. 2 is a perspective view of a portion of the apparatus of FIG. 1.
Figure 3:
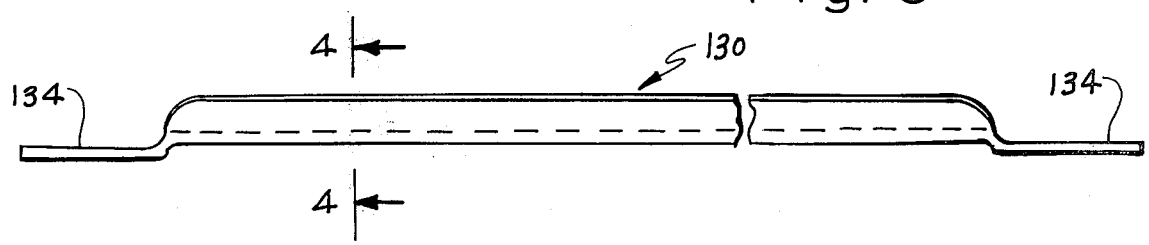
FIG. 3 is a side elevational view of a portion of the apparatus of FIG. 1.
Figure 4:
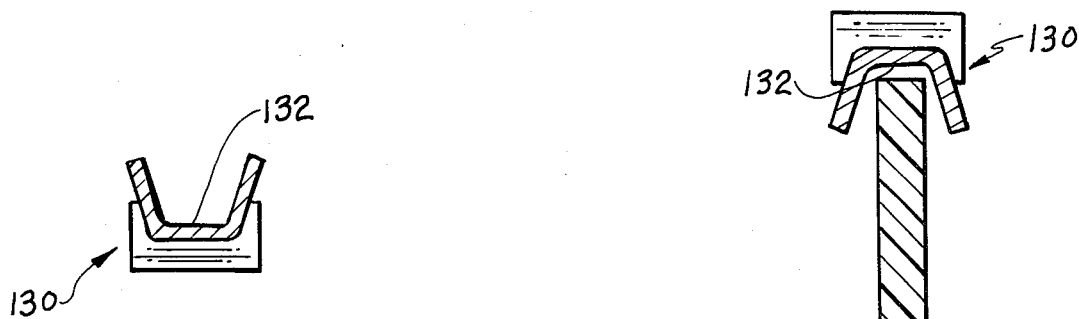
FIG. 4 is a sectional view along the lines 4—4 in FIG. 3.

A card cage 10 embodying the invention is illustrated in the drawings and includes left and right end plates 20 and 30, which are identical in size and shape and to which are secured upper channels 40 and 50 and lower channels 60 and 70, which are identical in size and shape. The channels are generally U-shaped, and each includes an end wall 80, a connector wall 90, and a parallel wall 100 opposite wall 90. The connector wall 90 of each channel is provided with pairs of parallel arcuate bridges 120 along the length of the inner surface of the wall. The bridges 120 are curved and define spaces between them and wall 90 for a purpose to be described. The pairs of bridges extend along wall 90 at accurately spaced intervals. The bridges may be punched out or formed in any suitable fashion.

Figure 5:
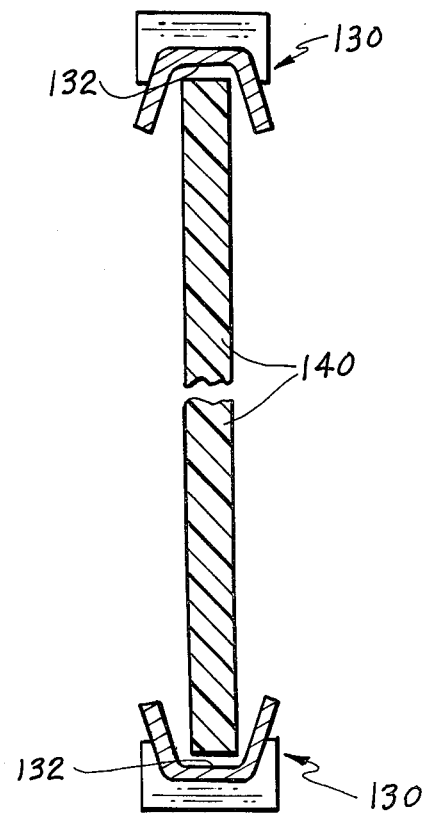
FIG. 5 is a sectional view of a portion of the apparatus of FIG. 1 illustrating the support of a circuit card.

The card cage 10 includes elongated card-supports 130, which are identical in size and shape, each of which includes a channel-shaped portion 132 and two coplanar end portions 134 which are offset from the channel-shaped portion and are adapted to engage bridges 120, as described below. The channel-shaped portions 132 define a channel or slot which is generally wide enough to receive a circuit card 140 (FIG. 5).

In the assembled card cage 10 (FIG. 1), the upper channels 40 and 50 are secured to the end plates 20 and 30, with the walls 90 down and coplanar, in a horizontal plane and with the bridges 120 facing up; the lower channels 60 and 70 are secured to the end plates, with walls 90 generally coplanar in a horizontal plane and facing up and with the bridges 120 facing down; and the card-supports 130 are coupled between the upper walls and the lower walls, with the end portions 134 slipped into the spaces between the bridges 120 and walls 90 and mechanically engaging the bridges 120 and walls 90. The channel members are aligned so that the upper and lower members 130 are horizontally oriented parallel to each other and aligned one above the other in pairs so that a card 140 can be held vertically between them, with adjacent cards being parallel with each other. Since the portions 134 are offset from the channeled portions 132, the card-receiving portions 132 are below upper walls 90 and above the lower walls 90 so that the cards 140 can be aligned with a pair of upper and lower card-supports and can be easily inserted into the channel portions 132 and set in place in the cage. Members 130 are set in place so that the channeled portions 132 face each other, that is, the portions 132 in the upper members 130 face down, and the channeled portions 132 in the lower members 130 face up.

The advantages of the invention will be immediately apparent to those skilled in the art. For one thing, the invention provides complete flexibility in the size of the card cage; all of the parts may be made as large or as small as desired and spaced apart as desired to provide card cages of any desired size to accommodate electronic circuit cards of any desired size. By changing the size of the end plates and thus changing the spacing between the U-shaped members, one can provide card cages which will accommodate circuit cards of different sizes. Also, by changing the length of the U-shaped members, one can provide card cages which will accommodate different numbers of circuit cards. Both parameters can be changed to provide card cages which will accommodate different sizes and different numbers of circuit cards.

Another advantage is that, in any one size of card cage, corresponding parts are identical, that is, the end plates 20 and 30 are identical, the members 40, 50, 60, and 70 are identical, and the members 130 are identical.

It will be understood that modifications in some of the specific features described may be made within the scope of the invention. For example, the bridges 120 need not necessarily be provided in pairs—one bridge at each position may suffice.

What is claimed is:

1. An electronic circuit card cage including
   two end plates,
   spaced-apart first and second upper support members adjustably secured between said end plates,
   said first and second upper support members each having a horizontal upper connector wall, both said upper connector walls lying in a first common horizontal plane,
   first arcuate bridges formed on said upper connector walls of said first and second upper support members and defining therewith spaces into which members can be inserted, said arcuate bridges being spaced apart on the length of said upper connector walls, each arcuate bridge on one upper connector wall being aligned with an arcuate bridge on the other upper connector wall,
   spaced-apart first and second lower support members adjustably secured between said end plates, said first and second lower support members each having a horizontal lower connector wall, both said lower connector walls lying in a second common horizontal plane, second arcuate bridges formed on said lower connector walls of said first and second lower support members and defining therewith spaces into which members can be inserted, said arcuate bridges being spaced apart on the length of said lower connector walls, each second arcuate bridge on one lower connector wall being aligned with an arcuate bridge on the other lower connector wall, said first and second horizontal planes being spaced from each other and defining a space within which electronic circuit cards can be positioned, and first channel-shaped elongated card-support members coupled between said first and second upper support members, and second channel-shaped elongated card-support members coupled between said first and second lower members, all of said first and second channel-shaped members having end portions which enter the spaces formed by and engage said arcuate bridges whereby each channel-shaped member can be secured in place between aligned arcuate bridges on a first and on a second upper or lower support member, each first channel-shaped member being disposed vertically above a second channel-shaped member with the first member facing down and the second member facing up so that an electronic circuit card can be inserted between them and supported in their facing channels.

2. The apparatus defined in claim 1 wherein each channel-shaped member includes a channel portion and said end portions, said end portions being offset from the channel portion between them whereby, when said channel-shaped members are coupled to said support members, they are disposed below the upper support members and above the lower support members so that circuit cards can be inserted between them freely.

* * * * *